US010320340B1

(12) United States Patent
Pratt et al.

(10) Patent No.: US 10,320,340 B1
(45) Date of Patent: Jun. 11, 2019

(54) FREQUENCY-SHAPED DIGITAL PREDISTORTION

(71) Applicant: Analog Devices Global Unlimited Company, Hamilton (BM)

(72) Inventors: Patrick Pratt, Mallow (IE); David Jennings, Bristol (GB)

(73) Assignee: Analog Devices Global Unlimited Company, Hamilton (BM)

(*) Notice: Subject to any disclaimer, the term of this patent is extended or adjusted under 35 U.S.C. 154(b) by 0 days.

(21) Appl. No.: 15/868,295

(22) Filed: Jan. 11, 2018

(51) Int. Cl.
 *H03F 1/32* (2006.01)
 *H03F 3/24* (2006.01)
 (Continued)

(52) U.S. Cl.
 CPC ......... *H03F 1/3247* (2013.01); *H03F 1/3258* (2013.01); *H03F 3/245* (2013.01);
 (Continued)

(58) Field of Classification Search
 CPC ...... H03F 1/3247; H03F 1/3258; H03F 3/245; H04B 17/104; H03M 1/183; H04L 25/49
 See application file for complete search history.

(56) References Cited

U.S. PATENT DOCUMENTS 3,978,422 A 8/1976 Rheinfelder
6,112,062 A 8/2000 Hans et al.
 (Continued)

FOREIGN PATENT DOCUMENTS

EP 1819039 8/2007

OTHER PUBLICATIONS

Batista, Eduardo L.O, et al., "New insights in adaptive cascaded fir structure: application to fully adaptive interpolated fir structures", 15th European Signal Processing Conference (EUSIPCO 2007), Poznan, Poland, Sep. 3-7, 2007,, (Sep. 2007), 5 pgs.
 (Continued)

*Primary Examiner* — Jaison Joseph
(74) *Attorney, Agent, or Firm* — Schwegman Lundberg & Woessner, P.A.

(57) ABSTRACT

Various examples are directed to a digital predistortion (DPD) circuit comprising a DPD actuator circuit, a DPD feedback frequency-shaping filter, a basis matrix generator circuit, a basis matrix frequency-shaping filter, and a DPD adaption circuit. The DPD actuator circuit may generate a predistorted signal based at least in part on an input signal and a set of frequency-shaped DPD parameters. The DPD feedback frequency-shaping filter may filter a DPD feedback signal to generate a frequency-shaped DPD feedback signal. A passband of the DPD feedback frequency-shaping filter may include substantially all of a bandwidth of the input signal and exclude a distortion term outside the bandwidth of the input signal. The basis matrix generator may generate a basis matrix based at least in part on a power amplifier feedback signal The basis matrix frequency-shaping filter may generate a frequency-shaped basis matrix based at least in part on the basis matrix. The DPD adaption circuit may be configured to generate the set of frequency-shaped DPD parameters based at least in part on the frequency-shaped basis matrix and the frequency-shaped DPD feedback signal.

23 Claims, 11 Drawing Sheets

(51) Int. Cl.
*H03M 1/18* (2006.01)
*H04L 25/49* (2006.01)
*H04B 17/10* (2015.01)

(52) U.S. Cl.
CPC .......... *H03M 1/183* (2013.01); *H04B 17/104* (2015.01); *H04L 25/49* (2013.01); *H03F 2201/3224* (2013.01); *H03F 2201/3233* (2013.01)

(56) References Cited

U.S. PATENT DOCUMENTS

| | | | |
|---|---|---|---|
| 6,232,836 | B1 | 5/2001 | Zhou |
| 6,342,810 | B1* | 1/2002 | Wright ................. H03F 1/3241 330/124 D |
| 6,985,033 | B1* | 1/2006 | Shirali ................. H03F 1/3247 330/149 |
| 8,577,311 | B2 | 11/2013 | Wolf et al. |
| 9,660,675 | B2 | 5/2017 | Pratt et al. |
| 2005/0025323 | A1 | 2/2005 | Botti et al. |
| 2006/0158254 | A1 | 7/2006 | Johnson et al. |
| 2008/0218262 | A1 | 9/2008 | Ziegler et al. |
| 2009/0261899 | A1 | 10/2009 | Gomez et al. |
| 2010/0271125 | A1* | 10/2010 | Ohba ................. H03F 1/3247 330/149 |
| 2010/0329325 | A1 | 12/2010 | Mobin et al. |
| 2011/0135034 | A1* | 6/2011 | Mujica ................. H03F 1/3247 375/296 |
| 2014/0269987 | A1 | 9/2014 | Gubeskys et al. |
| 2014/0355714 | A1 | 12/2014 | Cheng et al. |
| 2014/0362900 | A1 | 12/2014 | Sperlich et al. |
| 2017/0104502 | A1* | 4/2017 | Pratt ........................ H03F 3/19 |
| 2017/0338842 | A1* | 11/2017 | Pratt .................... H04B 1/0475 |

OTHER PUBLICATIONS

"U.S. Appl. No. 14/982,701, Notice of Allowance dated Jan. 17, 2017", 12 pgs.

"U.S. Appl. No. 14/982,701, Corrected Notice of Allowance dated Apr. 20, 2017", 2 pgs.

"European Application Serial No. 16193368.4, Extended European Search Report dated Mar. 7, 2017", 9 pgs.

"U.S. Appl. No. 14/982,701, Examiner Interview Summary dated Jan. 17, 2017", 2 pgs.

"U.S. Appl. No. 14/982,701, Response filed Oct. 25, 2016 to Non Final Office Action dated Sep. 15, 2016", 17 pgs.

"U.S. Appl. No. 14/982,701, Non Final Office Action dated Sep. 15, 2016", 13 pgs.

"Presentation on Digital Predistortion of Power Amplifiers", (c) 2008 Agilent Technologies, Inc. [online]. Retrieved from the Internet: URL: www.agilent.com find eesof, (Jun. 2001), 33 pgs.

* cited by examiner

US 10,320,340 B1

FREQUENCY-SHAPED DIGITAL PREDISTORTION

TECHNICAL FIELD

This document pertains generally, but not by way of limitation, to integrated circuits and communication systems, and particularly, but not by way of limitation to digital predistortion for power amplifiers.

BACKGROUND

Communications over wired media, such as coaxial cable and over wireless media, such as RF transmission, often use a power amplifier (PA) in a transmitter to produce a signal for transmission over the medium. The PA circuit may include a PA with a nonlinear gain characteristic, such as gain compression, that occurs at higher power output levels. The nonlinear gain characteristic can lead to signal distortion at the higher power levels. Digital predistortion (DPD) is used to compensate for amplifier nonlinearities. A DPD actuator circuit applies predistortion to the amplifier input signal. The predistortion is determined using an inverse model of the amplifier's transfer characteristic, including distortion terms. A goal of the predistortion is to reduce distortion in the transmitted due to the PA gain nonlinearity.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
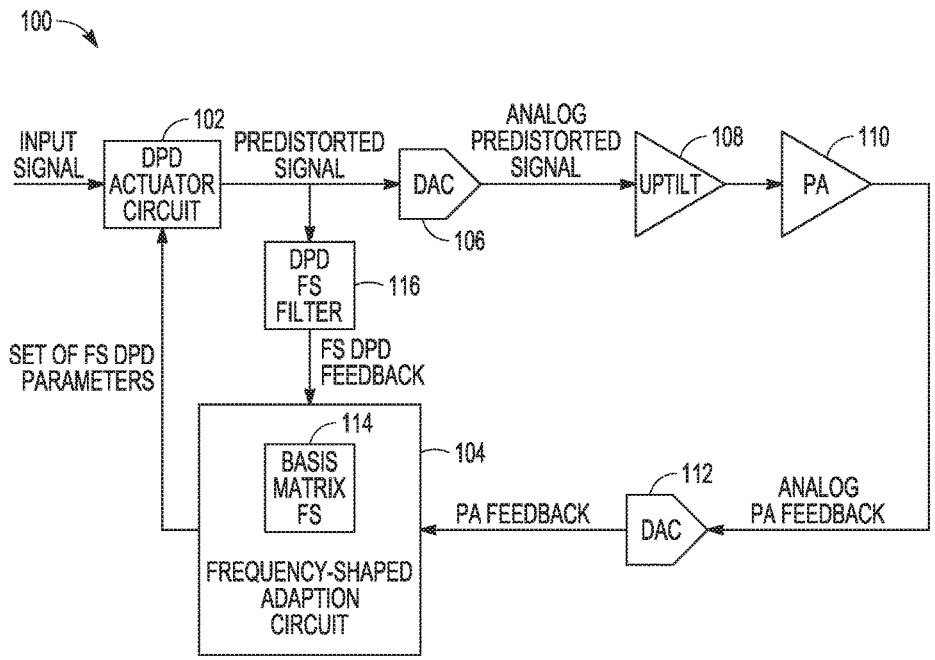
FIG. 1 is a diagram showing one example of a PA circuit implementing frequency-shaped DPD.

Various examples described herein are directed to systems and methods implementing frequency-shaped DPD for use with PAs. When a PA is operated at least in part in its nonlinear region, it produces distortions across a wide bandwidth, including distortion terms outside the bandwidth of the input signal. As a result, predistortion added to an input signal by a DPD has a similarly wide bandwidth. For example, predistortion to correct for second order distortion terms has a bandwidth of about twice the input signal bandwidth; predistortion to correct for third order distortion terms has a bandwidth of about three times the input signal bandwidth; and so on. As a result, a predistorted signal generated by the DPD may have an expanded bandwidth relative to the input signal.

Some DPD circuits utilize wideband components so as to avoid attenuating the expanded bandwidth of the predistorted signal. It is not always practical or even possible, however, to use wide bandwidth components. For example, it can be difficult and/or expensive to obtain some components, such as communication interfaces, converters, various filters, etc., with sufficient bandwidth. As a result, some DPD circuits include band-limited components that attenuate out-of-band predistortion. Accordingly, out-of-band predistortion added to the input signal at a DPD actuator circuit may not reach the PA or the DPD adaption circuit that trains the DPD actuator circuit. This has the potential to lessen the effectiveness of the DPD actuator circuit and increase distortion in the PA output.

Frequency-shaped DPD, as described herein, may address this by training the DPD actuator circuit to operate with a limited bandwidth. For example, a DPD adaption circuit generates DPD parameters for the DPD actuator circuit based at least in part on the feedback from the PA and on the predistorted signal generated by the DPD actuator circuit. The DPD parameters describe the predistortion to be generated by the DPD actuator circuit. For example, in a polynomial implementation, DPD parameters may include coefficients for a polynomial applied by the DPD circuit. In a look-up table (LUT) implementation, the DPD parameters include values and/or multipliers applied to a LUT. In various examples described herein, the DPD feedback is filtered to form a frequency-shaped DPD feedback signal. The frequency-shaped DPD feedback signal may have a bandwidth about equal to the bandwidth of the input signal and may exclude one or more predistortion terms outside of the input signal bandwidth. Similarly, in some examples, the PA output is used to generate a frequency-shaped basis matrix including a set of basis vectors. The basis matrix may be similarly frequency-shaped, for example, so as to have a bandwidth about equal to the bandwidth of the input signal and excluding one or more predistortion terms outside of the input signal bandwidth. The DPD adaption circuit generates frequency-shaped DPD parameters for the DPD actuator circuit based on the frequency-shaped DPD feedback and the frequency-shaped basis matrix.

In some examples, frequency-shaped DPD, as described herein, is used with DPD circuits and PAs for transmitting signals across mediums that exhibit frequency-dependent attenuation, such as coaxial cable. Cable exhibits a high-frequency roll-off characteristic in which higher frequencies are attenuated at higher levels than lower frequencies. Some example cables exhibit about 2 dB of signal amplitude reduction per 100 MHz of frequency, such as at frequencies above 50 MHz. To compensate for this, an uptilt filter is added, for example, after a digital-to-analog converter (DAC). The uptilt filter applies an "uptilt" frequency characteristic to the predistorted signal. The uptilt frequency characteristic amplifies higher frequency portions of the signal that are attenuated by the cable so as to reduce frequency-dependent distortions at the signal destination. In some examples, the uptilt frequency characteristic increases in gain by frequency according to an uptilt slope, with the signal amplitude increasing as frequency increases.

When an uptilt filter is used, for example, in a cable implementation, the DPD circuit may also include an equalizer filter. The equalizer filter places a tilt characteristic onto the predistorted signal, for example, prior to the uptilt filter. The tilt characteristic attenuates higher frequency portions of the signal. In some examples, the inverse tilt characteristic decreases in gain by frequency according to a tilt slope, which may be the inverse of the tilt slope up the uptilt filter.

Some arrangements with an uptilt filter and equalizer filter compromise the performance of the DPD actuator circuit for lower frequencies. In some examples described herein, low frequency DPD actuator circuit performance in the presence of an uptilt filter is improved by utilizing frequency-shaped DPD. For example, the frequency-shaping filter may also apply the tilt characteristic to the frequency-shaped DPD feedback signal. A similar tilt characteristic is also applied to the basis matrix. In this way, the performance of the DPD loop may be improved, as described herein.

FIG. 1 is a diagram showing one example of a DPD circuit 100 implementing frequency-shaped DPD. The DPD circuit 100 may be utilized in different applications including, for example, for transmissions through a cable (e.g., a coaxial cable) of a cable television network or similar network. The DPD circuit 100 includes a DPD actuator circuit 102 and a PA 110. In some examples, at least one of the components of the DPD circuit 100 is band-limited. For example, at least one of the components of the DPD circuit 100 may be limited to a bandwidth including the bandwidth of the input signal and excluding at least some out-of-band distortion.

The DPD actuator circuit 102 receives an input signal for transmission, e.g., over a wired medium such as cable. The DPD actuator circuit 102 adds predistortion to the input signal to generate a predistorted signal. The predistorted signal is provided to a DAC 106, which generates an analog predistorted signal. The analog predistorted signal is received by an uptilt filter 108 that applies an uptilt frequency characteristic to the analog predistorted signal. The uptilt frequency characteristic amplifies higher frequency portions of the signal that are attenuated by the cable so as to reduce frequency-dependent distortions at the signal destination. In some examples, the uptilt frequency characteristic increases in gain by frequency according to an uptilt slope, with the signal amplitude increasing as frequency increases. In some example cable implementations, the tilt slope is about +2 dB per 100 MHz for frequency content above about 50 MHz. The output of the uptilt filter is provided to the PA 110 for transmission, for example, over a cable or other transmission medium.

A frequency-shaped adaption circuit 104 is used to train the DPD actuator circuit 102. The frequency-shaped adaption circuit 104 generates a set of frequency-shaped DPD parameters that are provided to the DPD actuator circuit. The set of frequency-shaped DPD parameters describe the predistortion that the DPD actuator circuit 102 adds to the input signal to generate the predistorted signal. In some examples, the DPD actuator circuit 102 implements a polynomial approximation of a Volterra series model for the PA 110. The set of frequency-shaped DPD parameters may describe coefficients of the polynomial approximation. In some examples, the DPD actuator circuit 102 implements a look-up table (LUT) solution in place of some or all of a polynomial approximation. The frequency-shaped DPD parameters may describe LUT values, modifications to LUT values, or other suitable descriptions of a LUT.

The frequency-shaped adaption circuit 104 generates the set of frequency-shaped DPD parameters based at least in part on a frequency-shaped basis matrix and a frequency-shaped DPD feedback signal. For example, an analog PA feedback signal may be received at an analog-to-digital (ADC) 112. The ADC 112 generates a digital PA feedback signal that is provided to the frequency-shaped adaption circuit 104. The frequency-shaped adaption circuit 104 receives the PA feedback signal and generates a frequency-shaped basis matrix. For example, a basis matrix may be constructed from the PA feedback signal. The basis matrix may include values of the PA feedback signal captured over a set of sample periods. The basis matrix frequency-shaping filter 114 may apply a frequency-shaping characteristic to the basis matrix to generate the frequency-shaped basis matrix.

A frequency-shaping filter 116 applies a frequency-shaping characteristic to the predistorted signal or a derivative of the predistorted signal to generate the frequency-shaped DPD feedback signal. The frequency-shaping characteristic applied by the frequency-shaping filter 116 may be the same or substantially the same frequency-shaping characteristic applied by the basis matrix frequency-shaping filter 114.

In some examples, the frequency-shaping characteristic used by the frequency-shaping filter 116 and/or the basis matrix frequency-shaping filter 114 reduces the bandwidth of the predistorted signal and PA feedback signal around the bandwidth of the input signal. For example, the frequency-shaping characteristic may have a passband that is about equal to the bandwidth of the input signal. The passband may exclude predistortion (in the case of the predistorted signal) or distortion (in the case of the PA feedback signal) that occurs outside of the bandwidth of the input signal. This may improve the performance of the DPD actuator circuit 102 even when used with band-limited components. In some examples, the frequency-shaping characteristic also corrects for cable tilt. For example, the frequency-shaping characteristic may have a tilt slope from lower to higher frequencies.

The frequency-shaped adaption circuit 104 determines a revised set of frequency-shaped DPD parameters based at least in part on the frequency-shaped basis matrix and the frequency-shaped DPD feedback signal. For example, the revised set of frequency-shaped DPD parameters may be revised relative to a previous set of frequency-shaped DPD parameters used to generate the predistorted signal. For example, the frequency-shaped adaption circuit 104 may evaluate a mathematical model of the PA 110, such as a polynomial approximation of the Volterra series. The mathematical model may receive as inputs the frequency-shaped DPD parameters and generate an estimated predistorted signal. The frequency-shaped adaption circuit 104 finds the set of frequency shaped DPD parameters by minimizing a difference between the estimated predistorted signal and the actual predistorted signal, as indicated by the frequency-shaped DPD feedback signal. Any suitable method may be used to minimize the difference including, for example a least squares method that minimizes a sum of squares of the difference between the estimated and actual predistortion signal. Frequency-shaping DPD parameters, as described herein pushes distortion out-of-band, that is, outside the bandwidth of the input signal. Out-of-band distortion, in some examples, is addressed by suitable low-pass filtering.

In some implementations, such as cable implementations, out-of-band distortion may be lightly filtered or not filtered at all.

Figure 2:
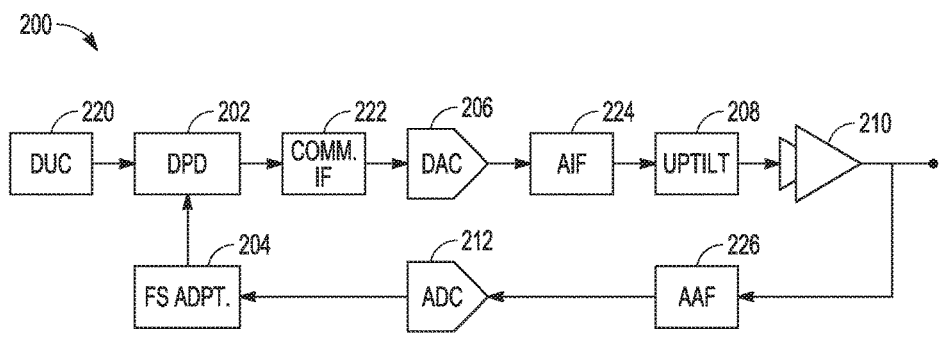
FIG. 2 is a diagram showing an example of a PA circuit demonstrating examples of band-limited components.

FIG. 2 is a diagram showing an example of a DPD circuit 200 demonstrating examples of band-limited components. The DPD circuit 200 includes a DPD actuator circuit 202, DAC 206, uptilt filter 208, PA, ADC 212, and frequency-shaped adaption circuit 204 similar to those of FIG. 1. The DPD circuit 200 also includes a digital up-converter (DUC) 220, a communication interface 222, reconstruction filter 224, and anti-aliasing (AAF) filter 226. The DUC 220 upconverts the input signal to baseband. The DUC 220 provides the input signal to the DPD actuator circuit 202, which generates a predistorted signal as described herein.

The communication interface 222 is configured to transfer the predistorted signal from the DPD actuator circuit 202 to the DAC 206. For example, the DPD actuator circuit 202 and DAC 206 may be implemented on different chips. The DPD actuator circuit 202 may be implemented at a field programmable gate array (FPGA), application-specific integrated circuit (ASIC), or other suitable chip. The DAC 206 may be implemented on a separate silicon chip. The communication interface 222 may process communications between the chip including the DPD actuator circuit 202 and the chip including the DAC 206. The communication interface 222 may be configured according to any suitable protocol such as, for example, the JESD204 protocol.

The reconstruction filter 224, sometimes referred to as an anti-imaging filter or AIF, may be a low-pass filter having any suitable passband for removing high frequency sampling images from the output of the DAC 206. Similarly, the anti-aliasing filter 226 may be a low-pass filter having and suitable passband for removing high-frequency content from the analog PA feedback signal that could cause aliasing after the ADC 212.

In the example DPD circuit 200, the communication interface 222, the reconstruction filter 224, the anti-aliasing filter 226 and/or the uptilt filter 208 may be band limited. For example, it may be difficult and/or expensive to obtain examples of these components with a bandwidth wide enough to incorporate the predistortion added by the DPD actuator circuit 202. The PA 210 may be operated in a nonlinear manner, causing it to generate out-of-band distortion, which may be attenuated with suitable filtering. The DPD actuator circuit 202 and adaption circuit 204, however, may be nonlinear and have a wide bandwidth.

Figure 3:
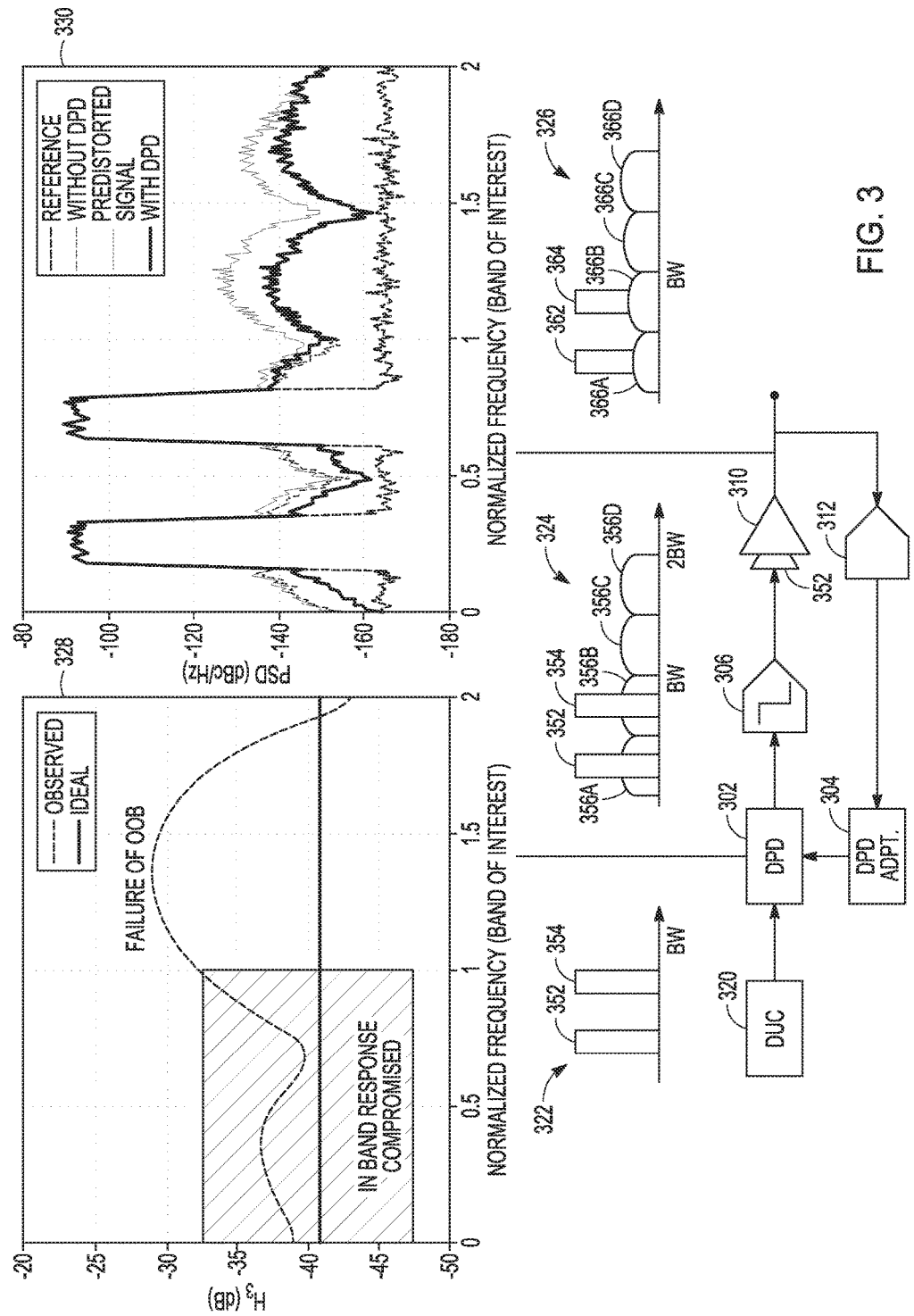
FIG. 3 is a diagram showing a PA circuit that demonstrates disadvantages of using band-limited components.

FIG. 3 is a diagram showing a PA circuit 300 that demonstrates disadvantages of using band-limited components. The PA circuit 300 includes a DPD actuator circuit 302, a DAC 306, and a PA 310. A DUC 320 upconverts the input signal, which is provided to the DPD actuator circuit 302. The DPD actuator circuit 302 adds predistortion to the input circuit to generate a predistorted signal. The predistorted signal is converted to analog by the DAC 306. In this example, the DAC 306 is band limited to about the bandwidth of the input signal. The output of the DAC is provided to the PA. An ADC 312 converts a PA feedback signal to digital and provides it to a DPD adapter circuit 304. The DPD adapter circuit 304 trains the DPD actuator circuit 302 by generating a set of DPD parameters.

Plot 322 shows an example of an input signal expressed by frequency content. In this example, the input signal has two frequency lobes 352, 354. Plot 324 shows the predistorted signal including the frequency lobes 352 plus predistortion terms 356A, 356B, 356C, 356D. Plot 324 also shows a low-pass characteristic 358 of the DAC. As shown the DAC attenuates predistortion terms 356C, 356D outside of the bandwidth of the input signal. Plot 326 shows the output of the PA 310, for example, with the DPD adaption circuit 304 operated without frequency-shaping. As shown, signal nodes 362, 364 correspond to input frequency lobes 352, 354. The performance of the DPD actuator circuit 302 in cancelling the in-band distortion terms 366A and 366B is compromised as the out-of-band predistortion terms 356C, 356D do not reach the PA 310.

A more detailed description of the performance of the PA circuit 300 DPD circuit 302 without frequency-shaping is provided at plots 330 and 328. Plot 330 shows power spectral density (PSD), on the vertical axis, by normalized frequency, on the horizontal axis. A reference signal shows the input signal, including frequency lobes corresponding to 352, 354. A "without DPD" signal shows the output of the PA with the DPD actuator circuit 302 turned off. As shown, distortion terms corresponding to 366A, 366B, 366C, 366D are present. The predistorted signal includes the frequency lobes of the input signal, as well as predistortion corresponding to the distortion terms of the "without DPD" signal.

The "with DPD" signal shows the frequency lobes of the input signal, as well as the out-of-band distortion terms. Finally, although in-band distortion terms are reduced, they are still 10-15 dB higher than the reference input signal. The reason for this is shown in the plot 328. The plot 328 shows the performance of the DPD actuator circuit 302 (vertical axis) by frequency (horizontal axis). Frequencies within the bandwidth of the input signal are within the hatched box. The plot 328 shows an ideal DPD performance and an observed DPD performance (e.g., without frequency-shaping). As shown, the observed performance of the DPD actuator circuit 302 drops off outside the input signal bandwidth. This makes sense because, as shown by the plot 324, the out-of-band predistortion 356C, 356D was removed from the predistorted signal, in this example, by the DAC 306. Plot 328 also shows, however, that relative to the ideal performance, the in-band performance of the DPD actuator circuit 302 is also compromised by the attenuation of the predistortion 356C, 356D. This may be addressed, as described herein, by frequency-shaping the DPD feedback signal and the basis matrix.

Figure 4:
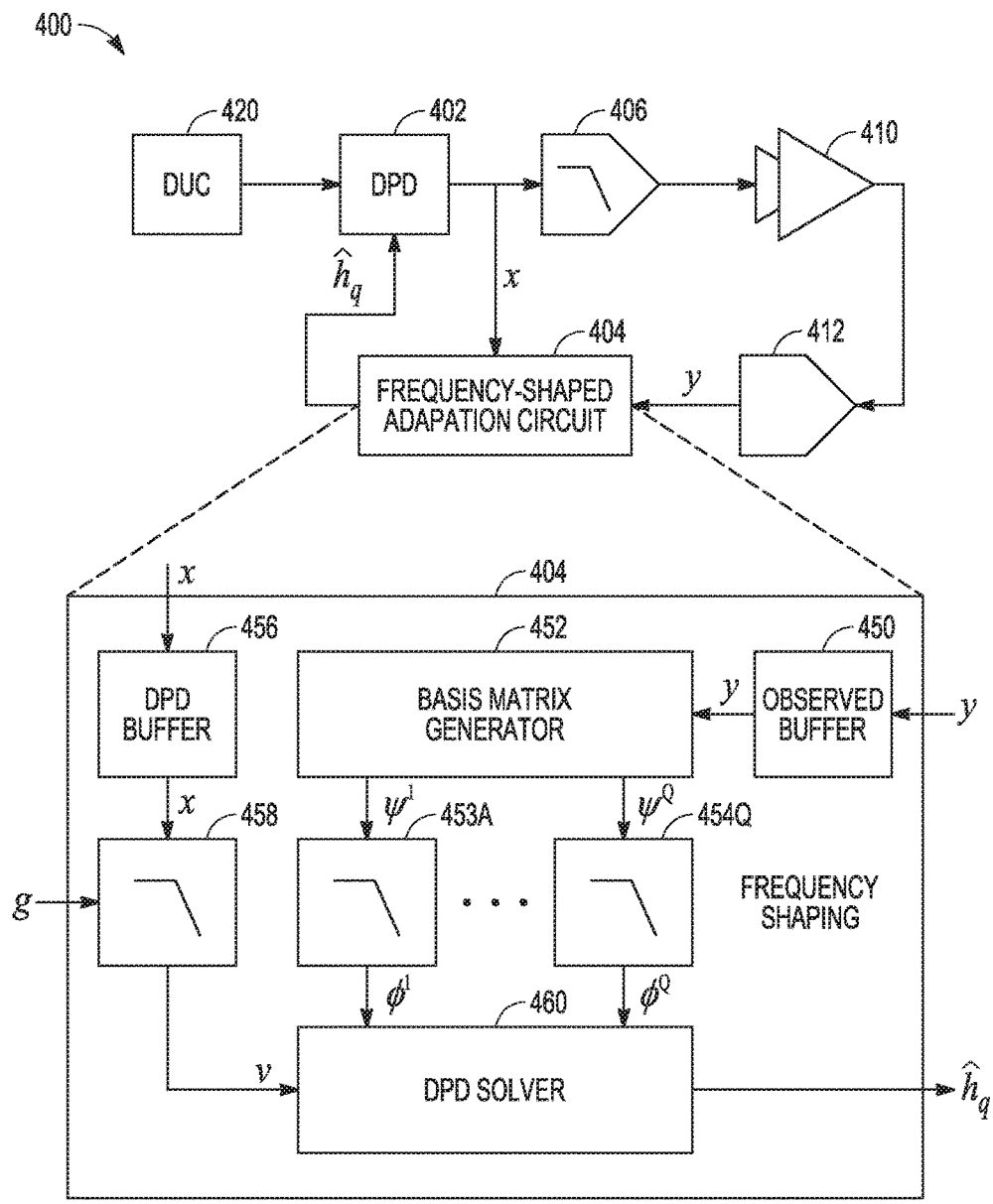
FIG. 4 is a diagram showing one example of a PA circuit showing additional details of a frequency-shaped adaption circuit.

FIG. 4 is a diagram showing one example of a DPD circuit 400 showing additional details of a frequency-shaped adaption circuit 404. The DPD circuit 400 includes a DUC 420 that provides an input signal to the DPD actuator circuit 402. A DAC 406, in this example, is band-limited to about the bandwidth of the input signal. The output of the DAC 406 is provided to the PA 410. A PA feedback signal is provided to the ADC 412, which generates a PA feedback signal y that is provided to the frequency-shaped adaption circuit 404.

The frequency-shaped adaption circuit 404 includes an observed buffer 450 that receives and buffers samples of the PA feedback signal y. The observed buffer 450 provides a PA feedback vector y, which is provided to a basis matrix generator circuit 452. The basis matrix generator 452 converts the PA feedback vector y to a basis matrix $\Psi_y$ given by Equation [1] below:

$$\Psi_y = [\psi^1, \psi^2, \psi^3, \ldots, \psi^q, \ldots, \psi^Q] \quad [1]$$

In Equation [1] individual basis vectors of the basis matrix are indicated by $\psi^k$ and described by Equation [2] below:

$$\psi^k = |y_m|^{k-1} y_m \quad [2]$$

In Equation [2], $y_m$ is a value of the PA feedback vector. A frequency-shaping filter, including filter components 454A, 454Q, is used to apply a frequency-shaping characteristic to the basis vectors $\psi^k$, resulting in a frequency-shaped basis matrix $\Phi_y$, described by Equation [3] below:

$$\Phi_y = [\phi^1, \phi^2, \phi^3, \ldots, \phi^q, \ldots, \phi^Q] \quad [3]$$

In Equation [3], frequency-shaped basis vectors are given by $\phi^k$.

A DPD buffer 456 receives a DPD feedback signal x. A DPD buffer 456 receives and buffers samples of the DPD feedback signal x. The DPD buffer 456 provides a DPD feedback vector x. A frequency-shaping filter 458 applies the frequency-shaping characteristic to the DPD feedback vector x, to generate a frequency-shaped DPD signal, represented by the vector v, given by Equation [4] below:

$$v = x * g \quad [4]$$

In Equation [4], g is the frequency-shaping characteristic such as, for example, a pulse response of the frequency-shaping characteristic.

The frequency-shaped DPD feedback signal v and the frequency-shaped basis matrix $\Phi_y$ are provided to a DPD solver 460. The DPD solver 460 may utilize the frequency-shaped DPD feedback signal v and the frequency-shaped basis matrix $\Phi_y$ to determine a set of frequency-shaped DPD parameters for the DPD actuator circuit 402, given by the vector $\hat{h}_q$ describes by Equation [5] below:

$$\hat{h}_q = \hat{h}_{q-1} + \mu \{\Phi_y^H \Phi_y + \lambda I\}^{-1} \Phi_y^H (v - \Phi_y \hat{h}_{q-1}) \quad [5]$$

For example, the DPD solver may find values for the vector $\hat{h}_q$ that minimize a difference between an estimated predistorted signal and the actual predistorted signal generated by the DPD actuator circuit 402, for example, using a least squares method.

Figure 5:
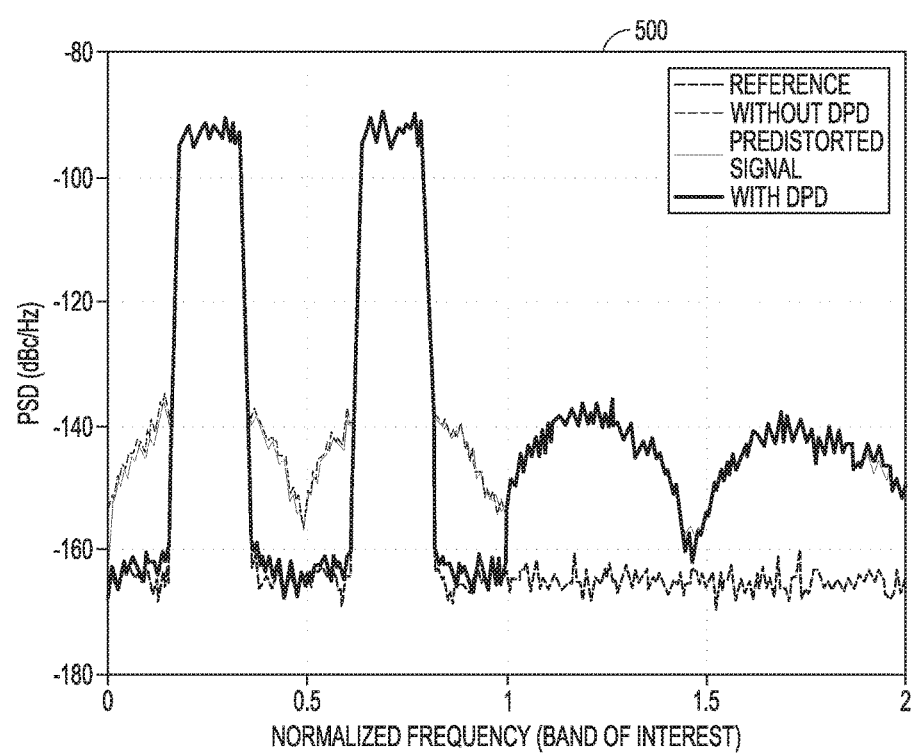
FIG. 5 is a plot that shows a spectral power density of the PA circuit of FIG. 4 by frequency.

FIG. 5 is a plot 500 that shows a spectral power density of the DPD circuit 400 by frequency. For example, the plot 500 is similar to the plot 330 showing the spectral power density of the PA circuit 300 without frequency-shaping enabled. The plot 500 shows a reference signal indicating an input as well as a "without DPD signal showing the output of the PA 410 with the DPD actuator circuit 402 disabled. The plot 500 also shows a predistorted signal generated by the frequency-shaping adaption circuit 404. As compared to the predistorted signal from the DPD actuator circuit 302 of FIG. 3 (plot 330), the higher-frequency predistortion has a lower power spectral density. The "with DPD" signal shown at the plot 500 demonstrates that in-band distortion terms are reduced nearly to the level of the reference signal, while out-of-band distortion terms remain.

Figure 6:
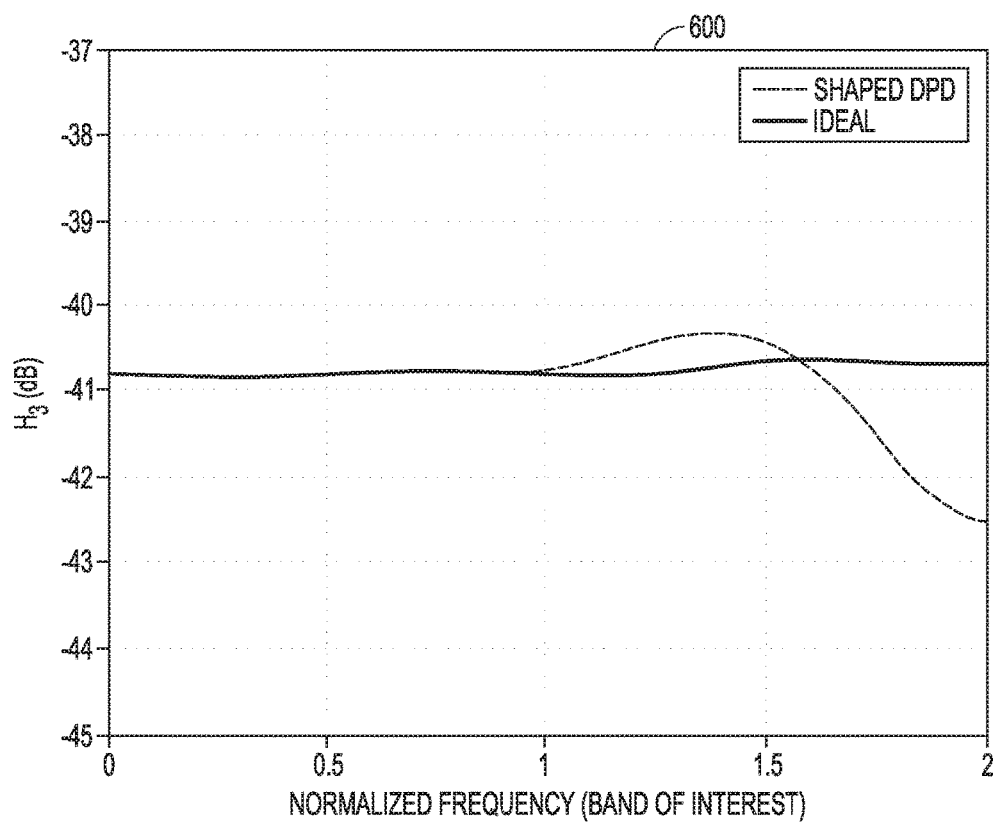
FIG. 6 is a plot that shows the performance of the DPD actuator circuit of FIG. 4 by frequency.

FIG. 6 is a plot 600 that shows the performance of the DPD actuator circuit 402 (vertical axis) by frequency (horizontal axis). An "ideal" plot shows performance in the absence of band-limiting components. A "shaped DPD" plot shows performance with the frequency-shaped DPD described with respect to FIG. 4. As shown, the performance of the frequency-shaped DPD is near the ideal performance for frequencies below 1 bandwidth of the input signal.

Figure 7:
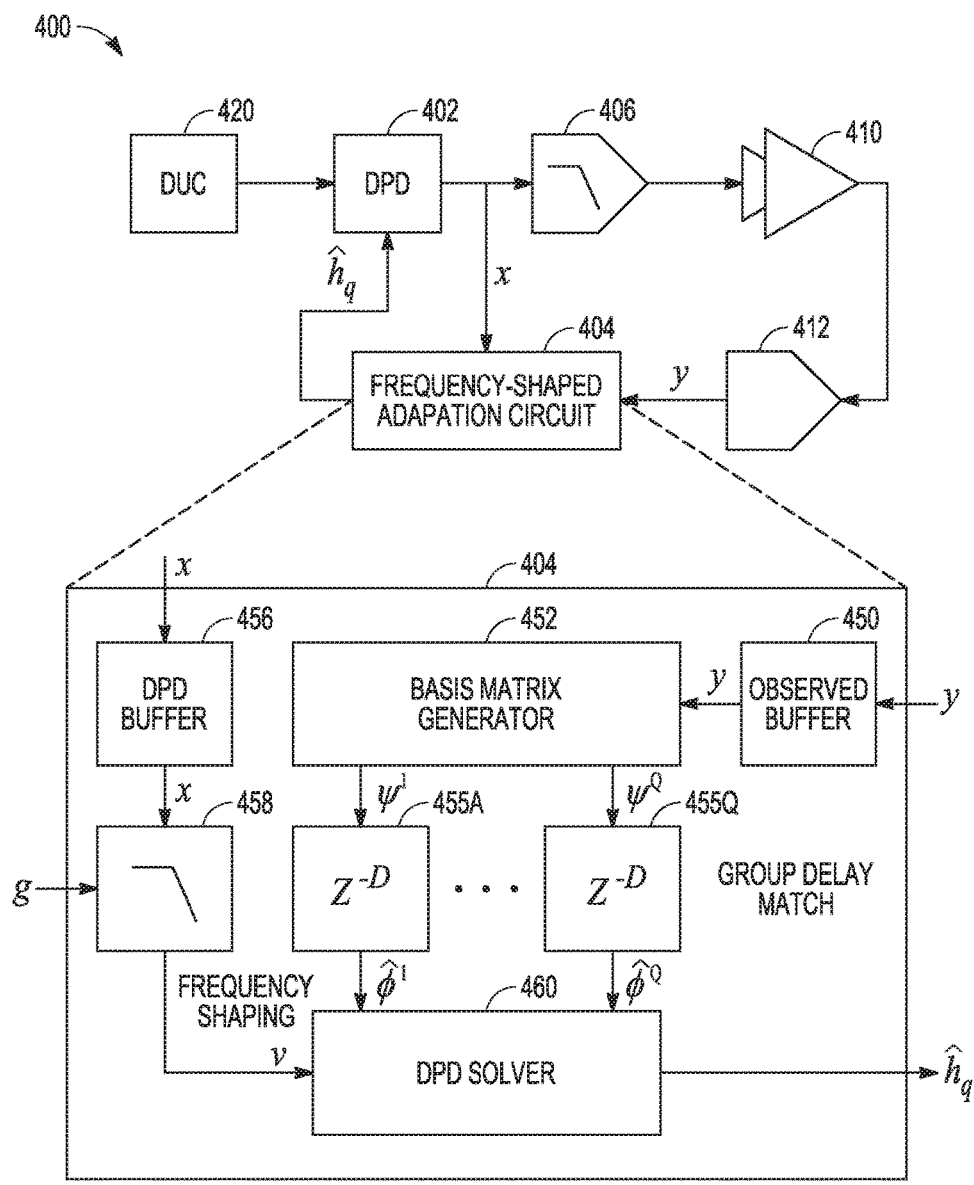
FIG. 7 shows another example of the PA circuit of FIG. 4 illustrating an example modification.

FIG. 7 shows another example of the DPD circuit 400 illustrating an example modification. In the example of FIG. 5, the frequency-shaping filter including filter components 454A, 454Q is replaced with a set of group delay circuits 455A, 455Q. The group delay circuits 455A, 455Q apply to the basis vectors a group delay of the frequency-shaping characteristic. In some examples, this simplifies the processing at the DPD solver 460 without significantly degrading the performance of the DPD actuator circuit 402.

Figure 8:
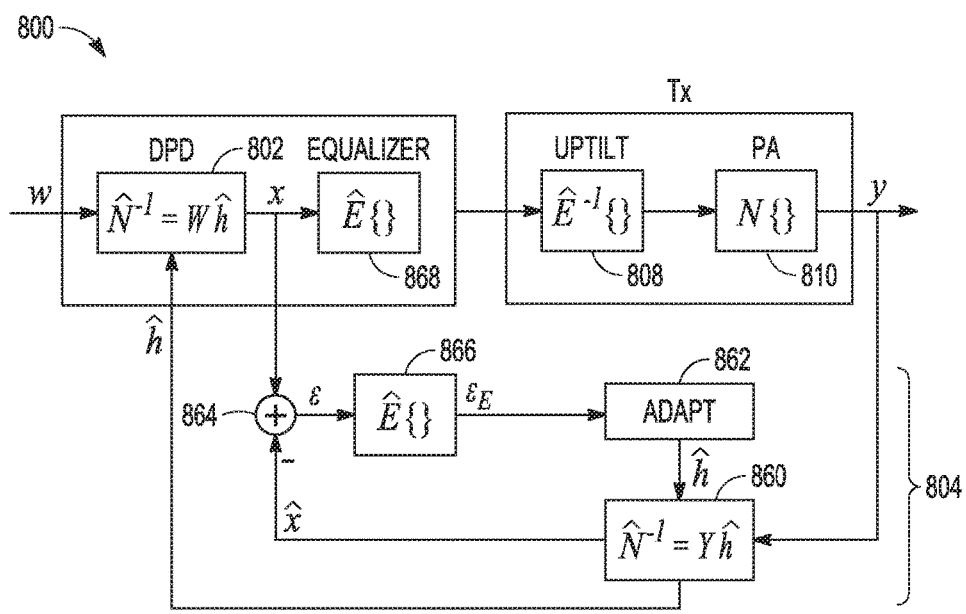
FIG. 8 is a diagram showing one example of a PA circuit incorporating tilt correction and frequency-shaping.

FIG. 8 is a diagram showing one example of a DPD circuit 800 incorporating tilt correction and frequency-shaping. The DPD circuit 800 includes a DPD actuator circuit 802 that receives an input signal w and generates a predistorted signal x. An uptilt filter 808 and PA 810 are also present. A frequency-shaped adaption circuit 804 is also shown. In the DPD circuit 800, the PA 810 has an input-output behavior characterized by $N\{\ \}$. The predistorted signal x generated by the DPD actuator circuit 802 is an inverse of the input-output behavioral characteristic of the PA 810, given by $\hat{N}^{-1}$. The predistorted signal x generated by the DPD actuator circuit 802 is given by Equation [6] below:

$$\hat{N}^{-1} = W\hat{h} \quad [6]$$

In Equation [6], $\hat{h}$ is the set of DPD parameters utilized by the DPD actuator circuit. The set of DPD parameters $\hat{h}$ may be determined by the adaption circuit 804, as described herein.

In the example of FIG. 8, the predistorted signal x is provided to an equalizer filter 868 having an equalizer characteristic given by $\hat{E}\{\ \}$. After conversion to analog, the signal is provided to the uptilt filter 808, having an uptilt characteristic given by $E^{-1}\{\ \}$. The PA 810 generates a PA output signal y that is also provided to the adaption circuit 804 as the PA feedback signal.

The uptilt characteristic $E^{-1}\{\ \}$ of the uptilt filter 808 amplifies higher frequency portions of the signal more than lower frequency portions of the signal. This may counteract frequency-dependent distortions caused by the transmission medium, such as cable. In some example cable implementations, the uptilt characteristic $E^{-1}\{\ \}$ has a tilt slope is about +2 dB per 100 MHz for frequency content above about 50 MHz. The uptilt slope will terminate at the band edge and transition into a band stop attenuation response. The equalizer characteristic $\hat{E}\{\ \}$ and uptilt characteristic $E^{-1}\{\ \}$ may be the inverse of one another. For example, in some cable implementations, the equalizer characteristic $\hat{E}\{\ \}$. has a tilt slope of about −2 dB per 100 MHz for frequency content above about 50 MHz.

In the DPD circuit 800, the adaption circuit comprises an adaption subcircuit 862 and an inverse model circuit 860. The inverse model circuit 860 operates according to an inverse model of the PA 810 given by Equation [7] below:

$$\hat{N}^{-1} = Y\hat{h} \quad [7]$$

In equation [7], $\hat{h}$ is a set of DPD parameters generated by the adaption subcircuit 862. Y is a basis matrix generated from the PA feedback signal y. The inverse model circuit 860 generates an estimated predistorted signal $\hat{x}$ representing an estimate of the predistorted signal in view of the basis matrix Y and the set of DPD parameters $\hat{h}$ generated by the adaption subcircuit 862. The basis matrix Y may be frequency-shaped, for example, as described herein with respect to FIG. 4.

A difference circuit 864 finds a difference between the estimated predistorted signal $\hat{x}$ and the actual predistorted signal x, to generate an error signal $\varepsilon$. The error signal $\varepsilon$ is provided to a frequency-shaping filter 866 that applies a frequency shaping characteristic to the predistorted signal. In some examples, the frequency-shaping characteristic is equivalent to the equalizer characteristic $\hat{E}\{\ \}$ of the equalizer 868. The result is a frequency-shaped error signal $\varepsilon_E$. The frequency-shaped error signal $\varepsilon_E$ may be a frequency-shaped DPD feedback signal.

The adaption subcircuit 862 is configured to generate the set of DPD parameters $\hat{h}$ to minimize the frequency-shaped error signal $\varepsilon_E$. Any suitable method may be used. For example, according to a least squares method, the adaption subcircuit 862 generates the set of DPD parameters $\hat{h}$ according to Equation [8] below:

$$\hat{h} = \{Y_{\hat{E}}^H Y_{\hat{E}}\}^{-1} Y_{\hat{E}}^H \varepsilon_{\hat{E}} \qquad [8]$$

This yields the iterative batch equation given by Equation [9]:

$$\hat{h}_k = \hat{h}_{k-1} + \mu \{Y_{\hat{E}}^H Y_{\hat{E}}\}^{-1} Y^H \varepsilon_{\hat{E}} \qquad [9]$$

The adaption subcircuit 862 may iteratively generate solutions to the Equation [9] with successive values of the basis matrix Y and frequency-shaped error signal $\varepsilon_{\hat{E}}$ until the solution converges (e.g., when the frequency-shaped error signal $\varepsilon_{\hat{E}}$ is less than a threshold value).

Figure 9:
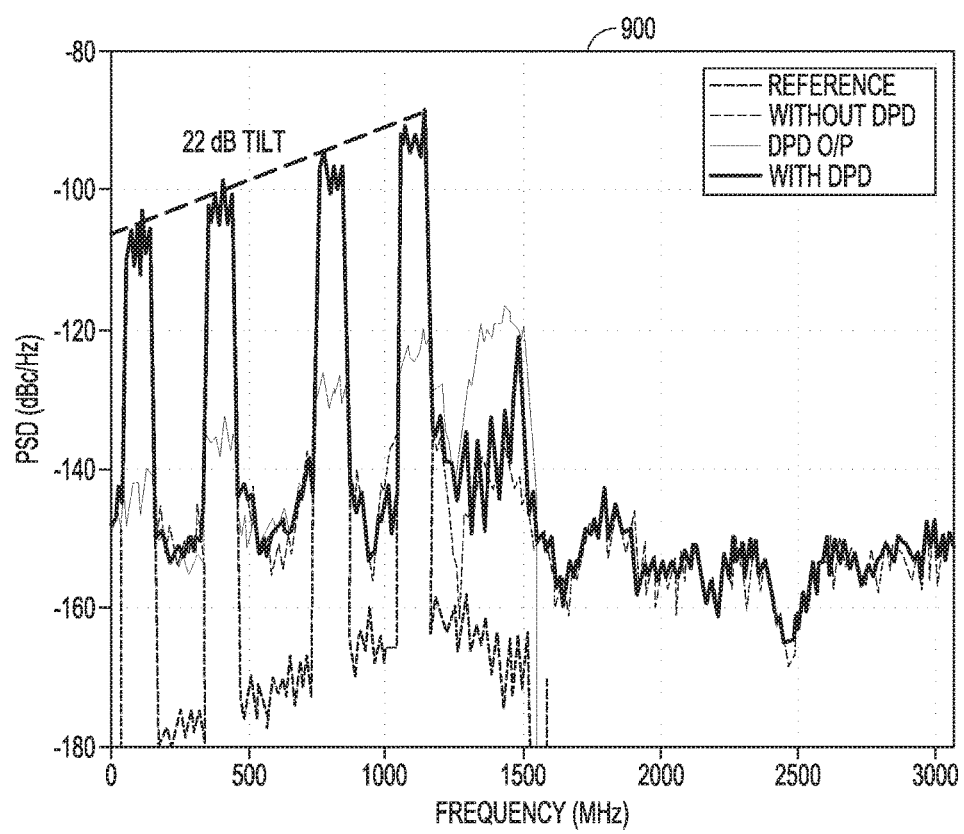
FIG. 9 is a plot showing an output of a PA with a DPD circuit that is configured to provide uptilt without frequency shaping.
Figure 10:
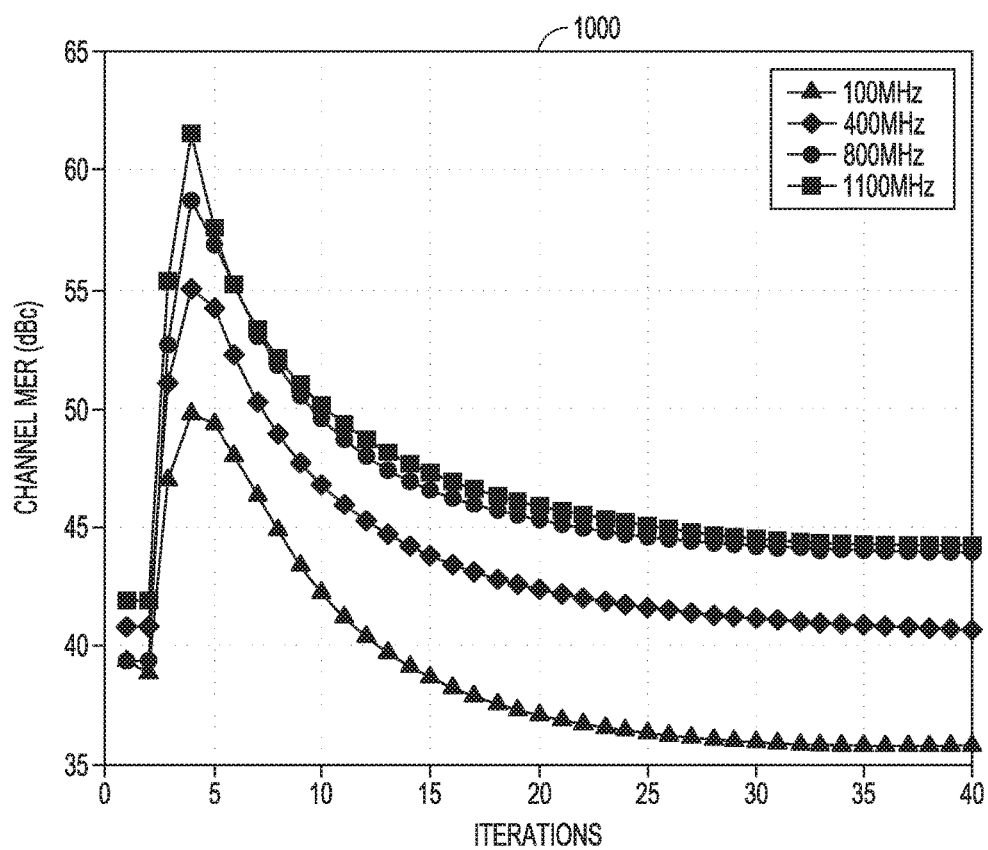
FIG. 10 is a plot indicating the performance of a DPD circuit configured to provide uptilt without frequency shaping, for example, as shown in FIG. 9.

Applicant submits that DPD circuit 800 provides several advantages over other uptilt configurations that do not include frequency-shaping. FIGS. 9 and 10 show plots describing the performance of a PA circuit utilizing an uptilt filter without frequency-shaping as described with respect to FIG. 8.

FIG. 9 is a plot 900 showing an output of a PA with a DPD circuit that is configured to provide uptilt without frequency shaping. The vertical axis shows power spectral density while the horizontal axis shows frequency. A reference signal ("Ref") shows the input to the PA. As shown, the reference signal has a 22 dB uptilt, for example, provided by an uptilt filter, such as the uptilt filter 108. A DPD output signal ("DPD o/p") shows the predistorted input signal provided by a DPD actuator circuit of the DPD circuit. The without DPD signal ("w/o") shows the output of the PA without use of a DPD actuator circuit. The with DPD signal ("w/h") shows the output of the PA with the DPD actuator circuit in use.

FIG. 10 is a plot 1000 indicating the performance of a DPD circuit configured to provide uptilt without frequency shaping, for example, as shown in FIG. 9. The plot 1000 indicates Modulation Error Ration (MER) of a PA output signal (vertical axis) by the number of iterations of the least squares batch equation (horizontal axis). MER is a measure of the overall transmitter accuracy. For example, the horizontal axis shows the number of solutions to a least squares iterative batch equation, such as Equation [9] above. The plot 1000 describes four different channels centered around the frequencies 100 MHz, 400 MHz, 800 MHz, and 1100 MHz. In this examples, all four frequencies are within the bandwidth of the input signal. The MER indicates the performance of the DPD circuit. A higher MER indicates superior performance, while a lower MER indicates inferior performance with more distortion. The plot 1000 describes a DPD circuit that includes an uptilt filter, but does not implement frequency-shaping.

The plot 1000 demonstrates that, without frequency-shaping, the MER of higher frequencies, such as 400 MHz, 800 MHz, and 1100 MHz initially improves. As the solution converges, the MER at 400 MHz, 800, MHz, and 1100 MHz is higher than at the beginning of the iteration process. At 100 MHz, however, the solution converges at an MER that is actually lower than at the beginning of the iteration process. This means that, for lower frequencies, the presence of the DPD circuit actually degrades the output of the PA.

Figure 11:
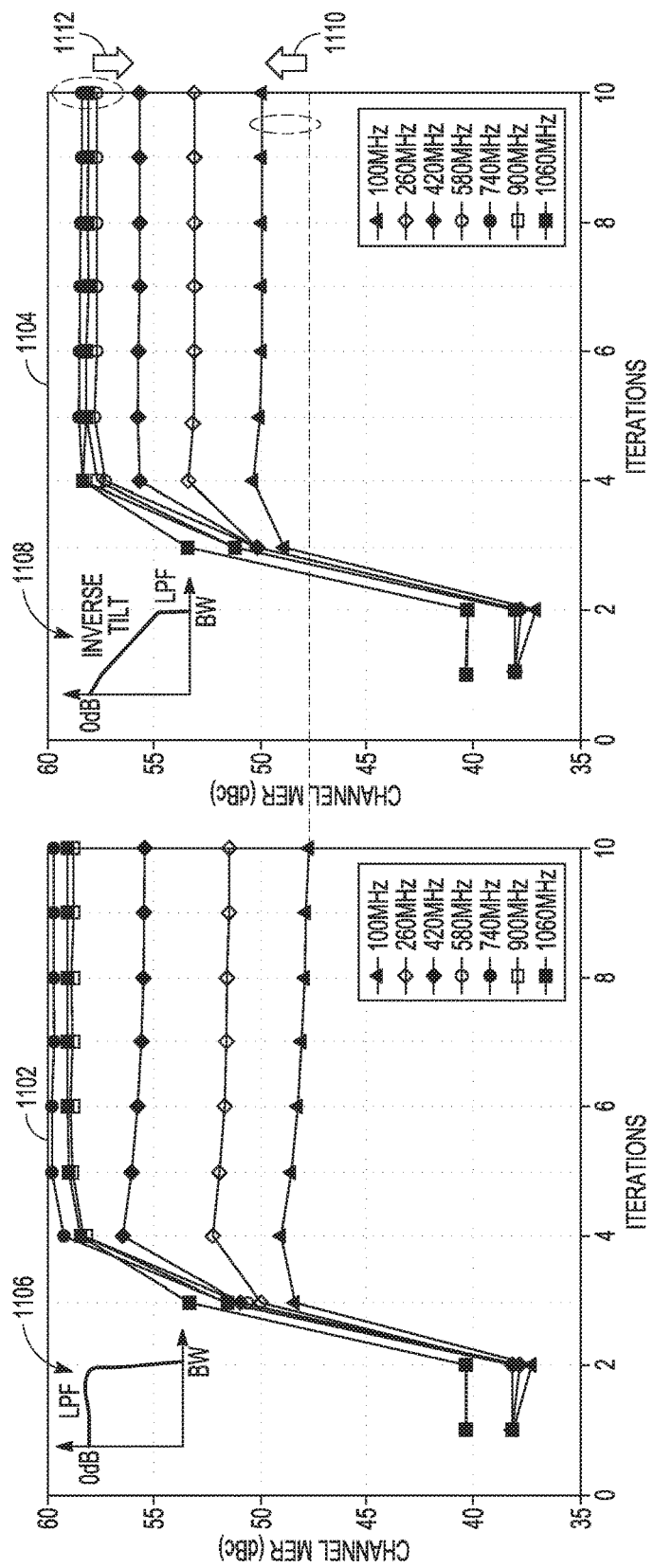
FIG. 11 shows two plots showing the performances of DPD circuits configured to provide uptilt and frequency shaping, as described herein.

FIG. 11 shows two plots 1102, 1104 showing the performances of DPD circuits configured to provide uptilt and frequency shaping, as described herein. The plot 1102 describes the performance of a DPD circuit configured to provide uptilt and frequency shaping. The plot 1102 also shows a frequency-shaping characteristic 1106 applied to the DPD circuit modeled at the plot 1102 to generate the performance of the DPD circuit indicated by the plot 1102. The frequency-shaping characteristic 1106 is illustrated on a plot where the vertical axis indicates gain and the horizontal axis indicates frequency. As shown, the frequency-shaping characteristic passes substantially all frequency content less than the bandwidth of the input signal (indicated by "BW") and attenuates frequency content greater than the input signal bandwidth. In this way, the frequency-shaping characteristic is a low-pass characteristic that passes substantially all of the bandwidth of the input signal. The frequency shaping characteristic 1106 also excludes distortion terms of the PA that are outside of the bandwidth of the input signal.

In the example of FIG. 11 illustrated by the plot 1102, the frequency shaping characteristic 1106 is applied to the DPD feedback signal, e.g., by a DPD frequency-shaping filter circuit, and to the basis matrix at the adaption circuit, as described here. Plot 1102 indicates that this arrangement improves the low-frequency performance of the DPD circuit as low-frequency performance of the DPD circuit is improved relative to the implementation described at FIG. 10 that did not include frequency shaping. For example, whereas the MER of the PA output at 100 MHz actually decreases from the beginning of the iteration process, all frequencies plotted in the plot 1102 have improved MERs as the solution converges.

FIG. 11 also shows another plot 1104 in which the DPD circuit described by the plot 1102 is implemented with a frequency-shaping characteristic 1108. The frequency shaping characteristic 1108, like the frequency shaping characteristic 1106 is low pass, in that substantially all frequencies in the input signal bandwidth are passed while frequencies outside of the input signal bandwidth are attenuated. The frequency-shaping characteristic 1108 also shows a tilt. For example, the gain of the frequency-shaping characteristic 1108 falls off with increasing frequency in within the input signal bandwidth. For example, the gain of the frequency-shaping characteristic may fall off at a tilt slope, such as about −2 dB per 100 MHz for frequency content above 50 MHz.

As shown, using the frequency-shaping characteristic 1108 increases the low frequency MER of the PA output relative to the frequency-shaping characteristic 1106 by about 3 dBc, indicated by arrow 1110. Use of the frequency-shaping characteristic 1108 also tends to decrease the MER of the PA output relative to the frequency-shaping characteristic 1106 by about 2 dBc, indicated by arrow 1112. Accordingly, although either frequency-shaping characteristic 1106, 1108 may be used, the frequency-shaping characteristic 1108 may be used in some examples where low frequency performance is desired.

Figure 12:
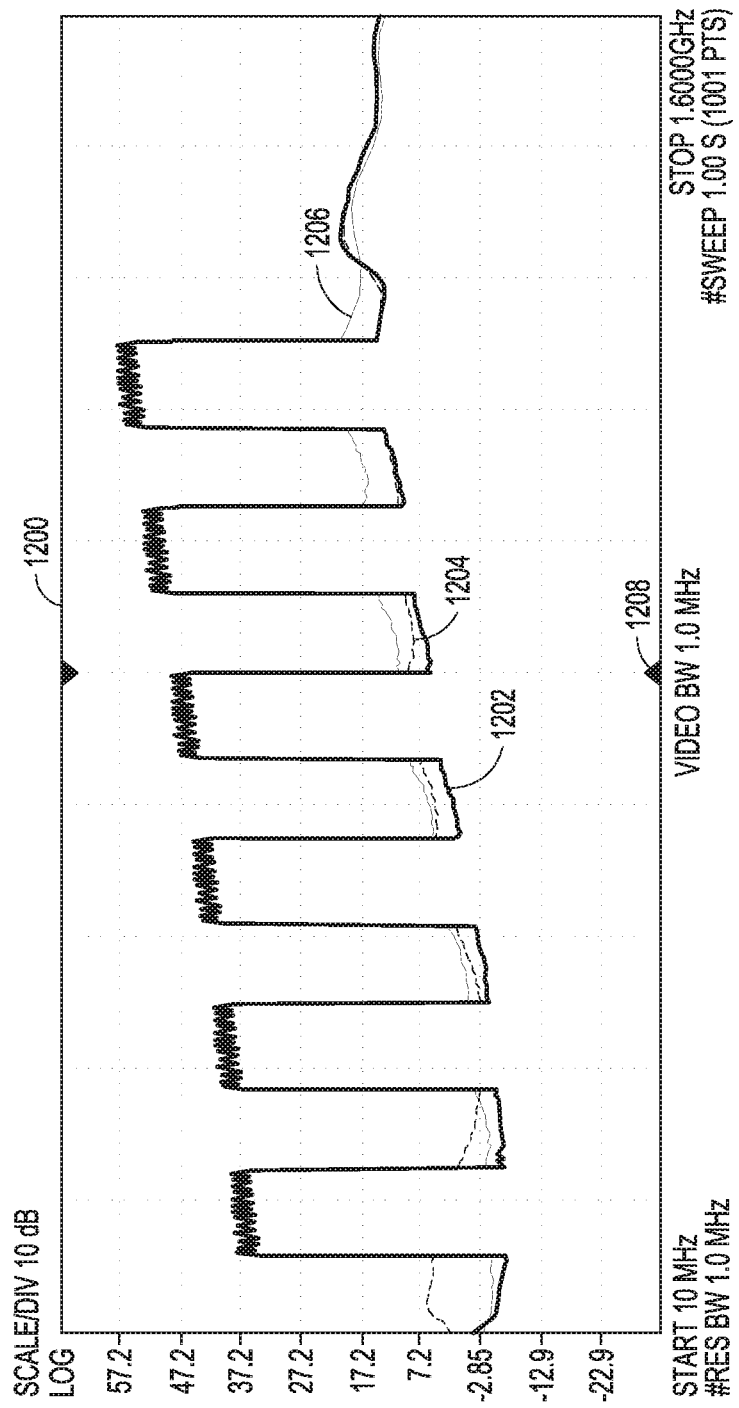
FIG. 12 is a plot indicating the performance of a PA operated under different condition types that demonstrates the performance of frequency-shaped DPD.

FIG. 12 is a plot 1200 indicating the performance of a PA operated under different condition types that demonstrates the performance of frequency-shaped DPD. The plot 1200 shows three waveforms 1202, 1204, 1206 on a horizontal axis indicating frequency and a vertical axis indicating power spectral density. The waveforms are based on an input signal that has frequency content at four lobes at or below an input signal bandwidth 1208. Two additional lobes of frequency content are also shown outside of the input signal bandwidth.

Waveform 1206 shows the performance of a PA without any DPD. As shown, significant distortion is shown between the channels of the input signal. Waveform 1204 shows the performance of the PA using a DPD circuit including an uptilt filter, but without frequency-shaping. At lower frequencies, the between-lobe (adjacent channel) distortion is actually increased relative to the waveform 1206 generated without predistortion. As frequency increases, however, the waveform 1204 shows improved distortion performance relative to the "without DPD" waveform 1206. The waveform 1206 shows the performance of a PA with a DPD circuit including an uptilt filter and frequency-shaping, as described herein. The waveform 1202 shows that distortion between the frequency lobes of the input signal is improved relative to the other waveforms 1202, 1204 across the input signal bandwidth 1208.

Various Notes & Examples

Example 1 is a digital predistortion (DPD) circuit with basis matrix-frequency shaping, comprising: a DPD actuator circuit configured to perform operations comprising generating a predistorted signal based at least in part on an input signal and a set of frequency-shaped DPD parameters; and a DPD feedback frequency-shaping filter configured to perform operations comprising filtering a DPD feedback signal to generate a frequency-shaped DPD feedback signal; a basis matrix generator circuit configured to perform operations comprising generating a basis matrix based at least in part on a power amplifier feedback signal; a basis matrix frequency-shaping filter configured to generate a frequency-shaped basis matrix based at least in part on the basis matrix; and a DPD adaption circuit configured to perform operations comprising generating a revised set of frequency-shaped DPD parameters based at least in part on the frequency-shaped basis matrix and the frequency-shaped DPD feedback signal.

In Example 2, the subject matter of Example 1 optionally includes wherein a passband of the DPD feedback frequency-shaping filter comprises substantially all of a bandwidth of the input signal and excludes a distortion term outside the bandwidth of the input signal.

In Example 3, the subject matter of any one or more of examples 1-2 optionally includes wherein a passband of the basis matrix frequency-shaping filter is about equal to the passband of the DPD feedback frequency-shaping filter.

In Example 4, the subject matter of any one or more of Examples 1-3 optionally includes wherein a gain of the DPD feedback frequency-shaping filter decreases at a tilt slope between a first frequency and a second frequency that is higher than the first frequency, and wherein a gain of the basis matrix frequency-shaping filter also decreases at the tilt slope between the first frequency and the second frequency.

In Example 5, the subject matter of any one or more of Examples 1-4 optionally includes wherein the basis matrix frequency-shaping filter is further configured to perform operations comprising applying a group delay to the basis matrix.

In Example 6, the subject matter of any one or more of Examples 1-5 optionally includes an amplifier inverse model circuit configured to perform operations comprising generating an estimated predistorted signal based at least in part on the frequency-shaped basis matrix; and a summer circuit configured to perform operations comprising generating the DPD feedback signal, wherein the DPD feedback signal is based at least in part on a difference between the estimated predistorted signal and the predistorted signal.

In Example 7, the subject matter of Example 6 optionally includes an equalizer filter configured to perform operations comprising generating an equalized predistorted input, wherein a gain of the equalizer filter decreases between a first frequency in a bandwidth of the input signal and a second frequency in the bandwidth of the input signal.

In Example 8, the subject matter of any one or more of Examples 6-7 optionally includes wherein generating the set of frequency-shaped DPD parameters comprises minimizing a least squares cost function of the amplifier inverse model.

In Example 9, the subject matter of any one or more of Examples 1-8 optionally includes a digital-to-analog converter (DAC) configured to perform operations comprising generating an analog predistorted signal based at least in part on the predistorted signal, an uptilt amplifier configured to perform operations comprising generating an uptilted predistorted signal, wherein the uptilt amplifier has a frequency-dependent gain; and a power amplifier configured to perform operations comprising generating an amplified signal based at least in part on the uptilted predistorted signal.

Example 10 is a method for performing digital predistortion (DPD) with basis matrix frequency-shaping, comprising: generating a predistorted signal based at least in part on an input signal and a set of frequency-shaped DPD parameters; generating a frequency-shaped DPD feedback signal based at least in part on a predistorted signal; generating a basis matrix based at least in part on a power amplifier feedback signal; generating a frequency-shaped basis matrix based at least in part on the basis matrix; and generating a revised set of frequency-shaped DPD parameters based at least in part on the frequency-shaped basis matrix and the frequency-shaped DPD feedback signal.

In Example 11, the subject matter of Example 10 optionally includes wherein a bandwidth of the frequency-shaped DPD feedback signal is about equal to a bandwidth of the input signal and excludes a distortion term outside the bandwidth of the input signal.

In Example 12, the subject matter of any one or more of examples 10-11 optionally includes wherein the generating of the frequency-shaped DPD feedback signal is performed by a DPD feedback frequency-shaping filter having a first passband, and wherein the generating of the frequency-shaped basis matrix is performed by a basis matrix frequency-shaping filter having a second passband that is about equal to the first passband.

In Example 13, the subject matter of any one or more of Examples 10-12 optionally includes wherein generating the frequency-shaped DPD feedback signal comprises applying a gain that decreases at a tilt slope between a first frequency and a second frequency that is higher than the first frequency.

In Example 14, the subject matter of any one or more of Examples 10-13 optionally includes wherein generating the frequency-shaped basis matrix comprises applying a group delay to the basis matrix.

In Example 15, the subject matter of any one or more of Examples 10-14 optionally includes generating an estimated predistorted signal based at least in part on the frequency-shaped basis matrix; and generating the DPD feedback signal, wherein the DPD feedback signal is based at least in part on a difference between the estimated predistorted signal and the predistorted signal.

In Example 16, the subject matter of Example 15 optionally includes generating, by an equalizer filter, an equalized predistorted input, wherein a gain of the equalizer filter decreases between a first frequency in a bandwidth of the input signal a second frequency in the bandwidth of the input signal.

In Example 17, the subject matter of any one or more of Examples 15-16 optionally includes wherein generating the estimated predistorted signal comprises applying an amplifier inverse model, and wherein generating the revised set of frequency-shaped DPD parameters comprises minimizing a least squares cost function of the amplifier inverse model.

In Example 18, the subject matter of any one or more of Examples 10-17 optionally includes generating, by a digital-to-analog circuit, an analog predistorted signal based at least in part on the predistorted signal, and generating, by an uptilt amplifier, an uptilted predistorted signal, wherein the uptilt amplifier has a frequency-dependent gain.

Example 19 is a system for performing digital predistortion (DPD) with basis matrix frequency-shaping, comprising: means for generating a predistorted signal based at least in part on an input signal and a set of frequency-shaped DPD parameters; and means for generating a frequency-shaped DPD feedback signal; means for generating a basis matrix based at least in part on a power amplifier feedback signal; means for generating a frequency-shaped basis matrix based at least in part on the basis matrix; and means for generating a revised set of frequency-shaped DPD parameters based at least in part on the frequency-shaped basis matrix and the frequency-shaped DPD feedback signal.

In Example 20, the subject matter of Example 19 optionally includes wherein a passband for the generating of the frequency-shaped basis matrix is about equal to a passband for generating the frequency-shaped DPD feedback signal.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The term "circuit" can include a dedicated hardware circuit, a general-purpose microprocessor, digital signal processor, or other processor circuit, and may be structurally configured from a general purpose circuit to a specialized circuit such as using firmware or software.

Any one or more of the techniques (e.g., methodologies) discussed herein may be performed on a machine. In various embodiments, the machine may operate as a standalone device or may be connected (e.g., networked) to other machines. In a networked deployment, the machine may operate in the capacity of a server machine, a client machine, or both in server-client network environments. In an example, the machine may act as a peer machine in peer-to-peer (P2P) (or other distributed) network environment. The machine may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions can enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Particular implementations of the systems and methods described herein may involve use of a machine (e.g., computer system) that may include a hardware processor (e.g., a central processing unit (CPU), a graphics processing unit (GPU), a hardware processor core, or any combination thereof), a main memory and a static memory, some or all of which may communicate with each other via an interlink (e.g., bus). The machine may further include a display unit, an alphanumeric input device (e.g., a keyboard), and a user interface (UI) navigation device (e.g., a mouse). In an example, the display unit, input device and UI navigation device may be a touch screen display. The machine may additionally include a storage device (e.g., drive unit), a signal generation device (e.g., a speaker), a network interface device, and one or more sensors, such as a global positioning system (GPS) sensor, compass, accelerometer, or other sensor. The machine may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device may include a machine readable medium on which is stored one or more sets of data structures or instructions (e.g., software) embodying or utilized by any one or more of the techniques or functions described herein. The instructions may also reside, completely or at least partially, within the main memory, within static memory, or within the hardware processor during execution thereof by the machine. In an example, one or any combination of the hardware processor, the main memory, the static memory, or the storage device may constitute machine readable media.

While the machine readable medium can include a single medium, the term "machine readable medium" may include a single medium or multiple media (e.g., a centralized or distributed database, and/or associated caches and servers) configured to store the one or more instructions.

The term "machine readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions may further be transmitted or received over a communications network using a transmission medium via the network interface device utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device may include one or more physical jacks (e.g., Ethernet, coaxial, or phone jacks) or one or more antennas to connect to the communications network. In an example, the network interface device may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine, and includes digital or analog communications signals or other intangible medium to facilitate communication of such software.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A digital predistortion (DPD) circuit with frequency shaping, comprising:
   a DPD actuator circuit configured to perform operations comprising generating a predistorted signal based at least in part on an input signal and a set of frequency-shaped DPD parameters; and
   a DPD feedback frequency-shaping filter configured to perform operations comprising filtering a DPD feedback signal to generate a frequency-shaped DPD feedback signal;
   a frequency-shaped feedback parameter circuit configured to perform operations comprising generating feedback parameter data based at least in part on a power amplifier feedback signal;
   a feedback parameter frequency-shaping filter configured to generate a frequency-shaped feedback parameter based at least in part on the feedback parameter; and a DPD adaption circuit configured to perform operations comprising generating a revised set of frequency-shaped DPD parameters based at least in part on the frequency-shaped feedback parameter and the frequency-shaped DPD feedback signal.

2. The DPD circuit of claim 1, wherein a passband of the DPD feedback frequency-shaping filter comprises substantially all of a bandwidth of the input signal and excludes a distortion term outside the bandwidth of the input signal.

3. The DPD circuit of claim 1, wherein a passband of the feedback parameter frequency-shaping filter is about equal to the passband of the DPD feedback frequency-shaping filter.

4. The DPD circuit of claim 1, wherein a gain of the DPD feedback frequency-shaping filter decreases at a tilt slope between a first frequency and a second frequency that is higher than the first frequency, and wherein a gain of the feedback parameter frequency-shaping filter also decreases at the tilt slope between the first frequency and the second frequency.

5. The DPD circuit of claim 1, wherein the feedback parameter frequency-shaping filter is further configured to perform operations comprising applying a group delay to the feedback parameter.

6. The DPD circuit of claim 1, further comprising:
an amplifier inverse model circuit configured to perform operations comprising generating an estimated predistorted signal based at least in part on the frequency-shaped feedback parameter; and
a summer circuit configured to perform operations comprising generating the DPD feedback signal, wherein the DPD feedback signal is based at least in part on a difference between the estimated predistorted signal and the predistorted signal.

7. The DPD circuit of claim 6, further comprising an equalizer filter configured to perform operations comprising generating an equalized predistorted input, wherein a gain of the equalizer filter decreases between a first frequency in a bandwidth of the input signal and a second frequency in the bandwidth of the input signal.

8. The DPD circuit of claim 6, wherein generating the set of frequency-shaped DPD parameters comprises minimizing a least squares cost function of the amplifier inverse model.

9. The DPD circuit of claim 1, further comprising:
a digital-to-analog converter (DAC) configured to perform operations comprising generating an analog predistorted signal based at least in part on the predistorted signal;
an uptilt amplifier configured to perform operations comprising generating an uptilted predistorted signal, wherein the uptilt amplifier has a frequency-dependent gain; and
a power amplifier configured to perform operations comprising generating an amplified signal based at least in part on the uptilted predistorted signal.

10. A method for performing digital predistortion (DPD) with frequency-shaping, comprising:
generating a predistorted signal based at least in part on an input signal and a set of frequency-shaped DPD parameters, generating a frequency-shaped DPD feedback signal based at least in part on a predistorted signal;
generating a feedback parameter based at least in part on a power amplifier feedback signal;
generating a frequency-shaped feedback parameter based at least in part on the feedback parameter; and
generating a revised set of frequency-shaped DPD parameters based at least in part on the frequency-shaped feedback parameter and the frequency-shaped DPD feedback signal.

11. The method of claim 10, wherein a bandwidth of the frequency-shaped DPD feedback signal is about equal to a bandwidth of the input signal and excludes a distortion term outside the bandwidth of the input signal.

12. The method of claim 10, wherein the generating of the frequency-shaped DPD feedback signal is performed by a DPD feedback frequency-shaping filter having a first passband, and wherein the generating of the frequency-shaped feedback parameter is performed by a feedback parameter frequency-shaping filter having a second passband that is about equal to the first passband.

13. The method of claim 10, wherein generating the frequency-shaped DPD feedback signal comprises applying a gain that decreases at a tilt slope between a first frequency and a second frequency that is higher than the first frequency.

14. The method of claim 10, wherein generating the frequency-shaped feedback parameter comprises applying a group delay to the feedback parameter.

15. The method of claim 10, further comprising:
generating an estimated predistorted signal based at least in part on the frequency-shaped feedback parameter; and
generating the DPD feedback signal, wherein the DPD feedback signal is based at least in part on a difference between the estimated predistorted signal and the predistorted signal.

16. The method of claim 15, generating, by an equalizer filter, an equalized predistorted input, wherein a gain of the equalizer filter decreases between a first frequency in a bandwidth of the input signal a second frequency in the bandwidth of the input signal.

17. The method of claim 15, wherein generating the estimated predistorted signal comprises applying an amplifier inverse model, and wherein generating the revised set of frequency-shaped DPD parameters comprises minimizing a least squares cost function of the amplifier inverse model.

18. The method of claim 10, further comprising:
generating, by a digital-to-annalog circuit, an analog predistorted signal based at least in part on the predistorted signal; and
generating, by an uptilt amplifier, an uptilted predistorted signal, wherein the uptilt amplifier has a frequency-dependent gain.

19. A system for performing digital predistortion (DPD) with frequency-shaping, comprising:
means for generating a predistorted signal based at least in part on an input signal and a set of frequency-shaped DPD parameters; and
means for generating a frequency-shaped DPD feedback signal;
means for generating a feedback parameter based at least in part on a power amplifier feedback signal;
means for generating a frequency-shaped feedback parameter based at least in part on the feedback parameter; and
means for generating a revised set of frequency-shaped DPD parameters based at least in part on the frequency-shaped feedback parameter and the frequency-shaped DPD feedback signal.

20. The system of claim 19, wherein a passband for the generating of the frequency-shaped feedback parameter is about equal to a passband for generating the frequency-shaped DPD feedback signal.

21. The DPD circuit of claim 1, wherein the feedback parameter comprises a basis matrix.

22. The method of claim 10, wherein the feedback parameter comprises a basis matrix.

23. The system of claim 19, wherein the feedback parameter comprises a basis matrix.

\* \* \* \* \*

UNITED STATES PATENT AND TRADEMARK OFFICE
CERTIFICATE OF CORRECTION

PATENT NO. : 10,320,340 B1  
APPLICATION NO. : 15/868295  
DATED : June 11, 2019  
INVENTOR(S) : Pratt et al.

Page 1 of 1

It is certified that error appears in the above-identified patent and that said Letters Patent is hereby corrected as shown below:

On the Title Page

In item (57), in "Abstract", in Column 2, Line 15, delete "signal" and insert --signal.-- therefor In the Claims In Column 17, Lines 61-62, in Claim 10, delete "parameters," and insert --parameters;¶-- therefor In Column 18, Line 44, in Claim 18, delete "digital-to-annalog" and insert --digital-to-analog-- therefor Signed and Sealed this  
Fourteenth Day of April, 2020

Andrei Iancu  
*Director of the United States Patent and Trademark Office*